United States Patent
Chen et al.

(10) Patent No.: US 8,603,882 B2
(45) Date of Patent: Dec. 10, 2013

(54) METHOD FOR MAKING DUAL SILICIDE AND GERMANIDE SEMICONDUCTORS

(75) Inventors: Szu-Hung Chen, Taipei (TW); Hung-Min Chen, Taipei (TW); Yu-Sheng Lai, Taipei (TW); Wen-Fa Wu, Taipei (TW); Fu-Liang Yang, Taipei (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 13/107,679

(22) Filed: May 13, 2011

(65) Prior Publication Data

US 2012/0190163 A1 Jul. 26, 2012

(30) Foreign Application Priority Data

Jan. 26, 2011 (TW) .............................. 100102815 A

(51) Int. Cl.
*H01L 21/336* (2006.01)

(52) U.S. Cl.
USPC .................... 438/305; 438/683; 257/E21.626

(58) Field of Classification Search
USPC .................. 438/307, 529, 651; 257/E21.626
See application file for complete search history.

(56) References Cited

U.S. PATENT DOCUMENTS

| 6,806,157 | B2 * | 10/2004 | Yang et al. | 438/306 |
| 7,544,575 | B2 | 6/2009 | Adetutu et al. | |
| 7,545,006 | B2 * | 6/2009 | Chen et al. | 257/382 |
| 2007/0123042 | A1 * | 5/2007 | Rim et al. | 438/683 |
| 2012/0132966 | A1 * | 5/2012 | Doris et al. | 257/288 |

* cited by examiner

Primary Examiner — Chandra Chaudhari
(74) Attorney, Agent, or Firm — Ditthavong, Mori & Steiner, P.C.

(57) ABSTRACT

A method for making a dual silicide or germanide semiconductor comprises steps of providing a semiconductor substrate, forming a gate, forming source/drain regions, forming a first silicide, reducing spacers thickness and forming a second silicide. Forming a gate comprises forming an insulating layer over the semiconductor substrate, and forming the gate over the insulating layer. Forming source/drain regions comprises forming lightly doped source/drain regions in the semiconductor substrate adjacent to the insulating layer, forming spacers adjacent to the gate and over part of the lightly doped source/drain regions, and forming heavily doped source/drain regions in the semiconductor substrate. The first silicide is formed on an exposed surface of lightly and heavily doped source/drain regions. The second silicide is formed on an exposed surface of lightly doped source/drain regions. A first germanide and second germanide may replace the first silicide and the second silicide.

20 Claims, 8 Drawing Sheets

METHOD FOR MAKING DUAL SILICIDE AND GERMANIDE SEMICONDUCTORS

FIELD OF THE INVENTION

The present invention relates to methods for making dual silicide and dual germanide semiconductors.

BACKGROUND OF THE INVENTION

Good conductivity is a high-performance feature of a semiconductor device. Because current and resistance are inversely related, using metal silicide on a semiconductor device can effectively reduce metal-oxide-semiconductor (MOS) transistor device contact resistance and achieve higher performance.

To improve performance of metal-oxide-semiconductor field-effect transistors (MOSFET), use of metal silicides is well known in the field of MOSFET fabrication.

U.S. Pat. No. 7,544,575 titled "Dual Metal Silicide Scheme Using A Dual Spacer Process" disclosed use of silicides to improve performance of the semiconductor device that comprises providing a polysilicon structure and source/drain regions formed adjacent to the polysilicon structure in which a dual silicide scheme is used to form first silicide regions in the polysilicon, source and drain regions using a first metal. After forming sidewall spacers, a second metal is used to form second silicide regions in the polysilicon, source and drain regions to reduce encroachment by the second silicide in the source/drain and to reduce resistance in the polysilicon structure caused by agglomeration and voiding the first silicide.

The second silicide regions usually use a metal such as nickel. A chemical reaction of nickel and silicon forms nickel silicide that has an advantage of low resistance. However nickel atoms spread very rapidly in silicon, easily react with the first silicide region and keep the first silicide from forming.

SUMMARY OF THE INVENTION

The objective of the present invention is to reduce resistance of semiconductor source/drain regions and comprises methods for making dual silicide and dual germanide semiconductors.

A method of making a dual silicide semiconductors in accordance with the present invention comprises steps of providing a semiconductor substrate, forming a gate assembly, forming source/drain regions, forming a first silicide, reducing spacers thickness and forming a second silicide. Forming a gate assembly comprises forming an insulating layer over the substrate and forming a gate over the insulating layer. Forming source/drain regions comprises forming lightly doped source/drain regions in the semiconductor substrate adjacent to the insulating layer, forming spacers adjacent to the gate and over part of the lightly doped source/drain regions and forming heavily doped source/drain regions in the substrate.

A first germanide and second germanide replace the first silicide and the second silicide to form a method of making dual germanide semiconductors in accordance with the present invention.

DETAILED DESCRIPTION OF THE PRESENT INVENTION

Figure 1:
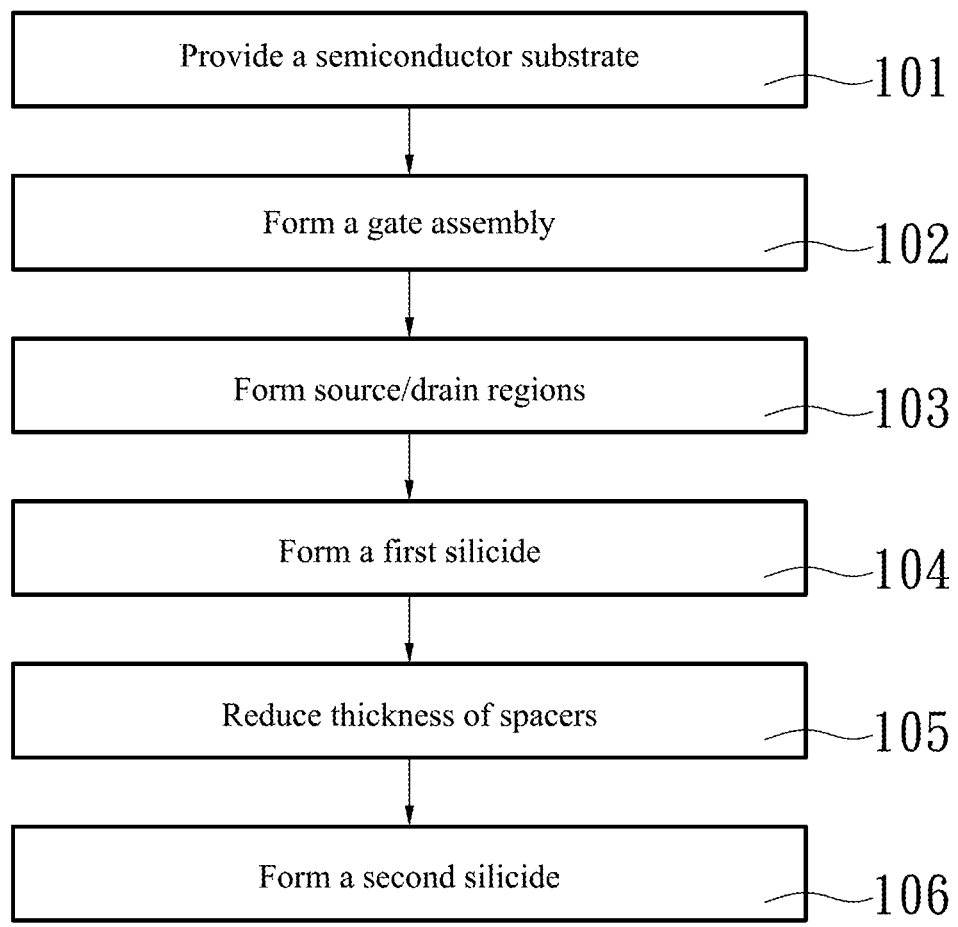
FIG. 1 is a flowchart of a method for making a dual silicide semiconductor in accordance with the present invention.
Figure 2:
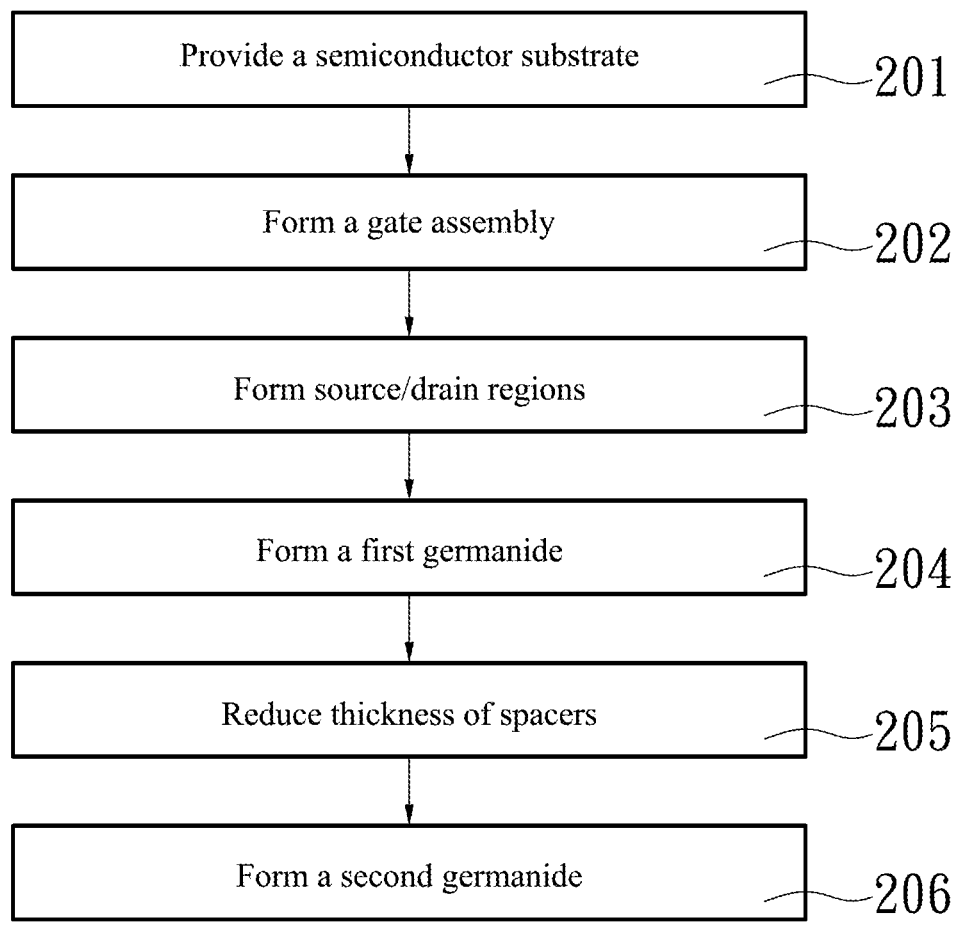
FIG. 2 is a flowchart of a method for making a dual germanide semiconductor in accordance with the present invention.
Figure 3:
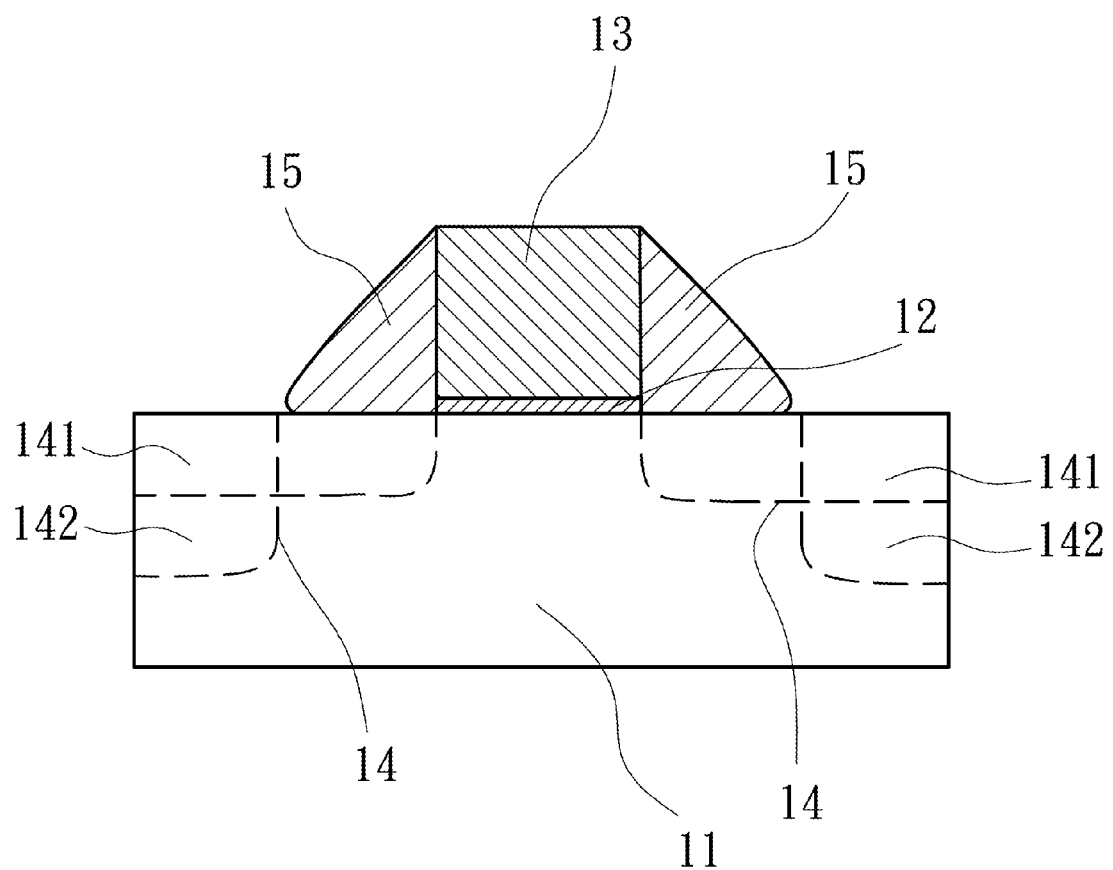
FIG. 3 is an end view in partial section of a metal oxide semiconductor field effect transistor (MOSFET) fabricated with the methods in FIGS. 1 and 2.

With reference to FIGS. 1 and 2, the present invention comprises a method for making a dual silicide semiconductor and a method for making a dual germanide semiconductor that can be used in semiconductor devices such as metal oxide semiconductor field effect transistors (MOSFET). One embodiment of the invention is an N-channel MOSFET and another embodiment is a P-channel MOSFET.

With further reference to FIG. 3-FIG. 8, a method for making a dual silicide semiconductor in accordance with the present invention comprises a step (101) of providing a semiconductor substrate (11), a step (102) of forming a gate assembly, a step (103) of forming source/drain regions (14), a step (104) of forming a first silicide (16), a step (105) of reducing thickness of spacers (15) and a step (106) of forming a second silicide (17).

Forming a gate assembly comprises forming an insulating layer (12) over the semiconductor substrate (11) and forming a gate (13) over the insulating layer (12). Forming source/drain regions (14) comprises forming lightly doped source/drain regions (141) in the semiconductor substrate (11) adjacent to the insulating layer (12), forming spacers (15) adjacent to the gate (13) and over part of the lightly doped source/drain regions (141) and forming heavily doped source/drain regions (142) in the semiconductor substrate (11). The first silicide (16) is formed on an exposed surface of lightly and heavily doped source/drain regions (14). Thickness of the spacers (15) are reduced so the lightly doped source/drain regions (141) of the exposed surface are not covered by the first silicide (16). The second silicide (17) is formed on an exposed surface of lightly doped source/drain regions (141).

A first germanide and second germanide may replace the first silicide (16) and the second silicide (17).

A method for making a dual germanide semiconductor in accordance with the present invention comprises a step (201) of providing a semiconductor substrate (11), a step (202) of forming a gate assembly, a step (203) of forming source/drain regions (14), a step (204) of forming a first germanide, a step (205) of reducing thickness of spacers (15), and a step (206) of forming a second germanide.

In steps (103) and (203) of forming source/drain regions (14), the source/drain regions (14) consist of lightly doped source/drain regions (141) and heavily doped source/drain regions (142). The lightly doped source/drain regions (141) in the semiconductor substrate (11) not covered by the gate (13) are formed by implantation. The heavily doped source/drain regions (142) in the semiconductor substrate (11) not covered by the gate (13) and the spacers (15) are formed by implantation.

In steps (104) and (204) of forming a first silicide (or germanide) (16), the first silicide (or germanide) (16) comprises forming a first metal layer (161) over the exposed surface of the lightly doped source/drain regions (141) and the heavily doped source/drain regions (142) not covered by the spacers (15) and annealing the first metal layer (161) to form the first silicide (or germanide) (16).

Figure 4:
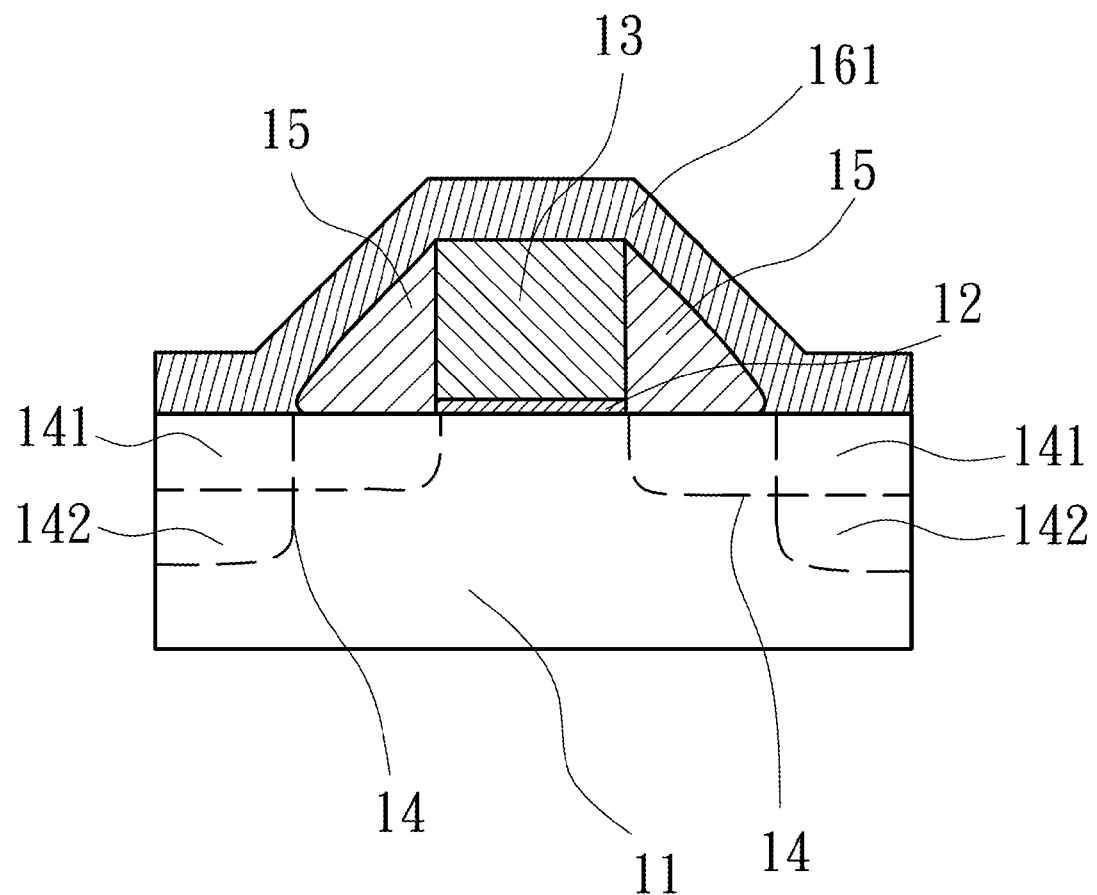
FIG. 4 is an end view in partial section of a MOSFET with a first metal layer over the MOSFET in FIG. 3.

With further reference to FIG. 4, the first metal layer (161) over the lightly doped source/drain regions (141), the heavily doped source/drain regions (142), the spacers (15) and the gate (13) is formed using any desired formation process (such as a process selected from a group consisting atomic layer deposition, electron beam evaporation, a sputtering technique and any combination(s) thereof) to a thickness of 20 to 1000 Angstroms. However, a thinner or thicker layer may also be used. The first metal layer (161) is nickel or cobalt.

Figure 5:
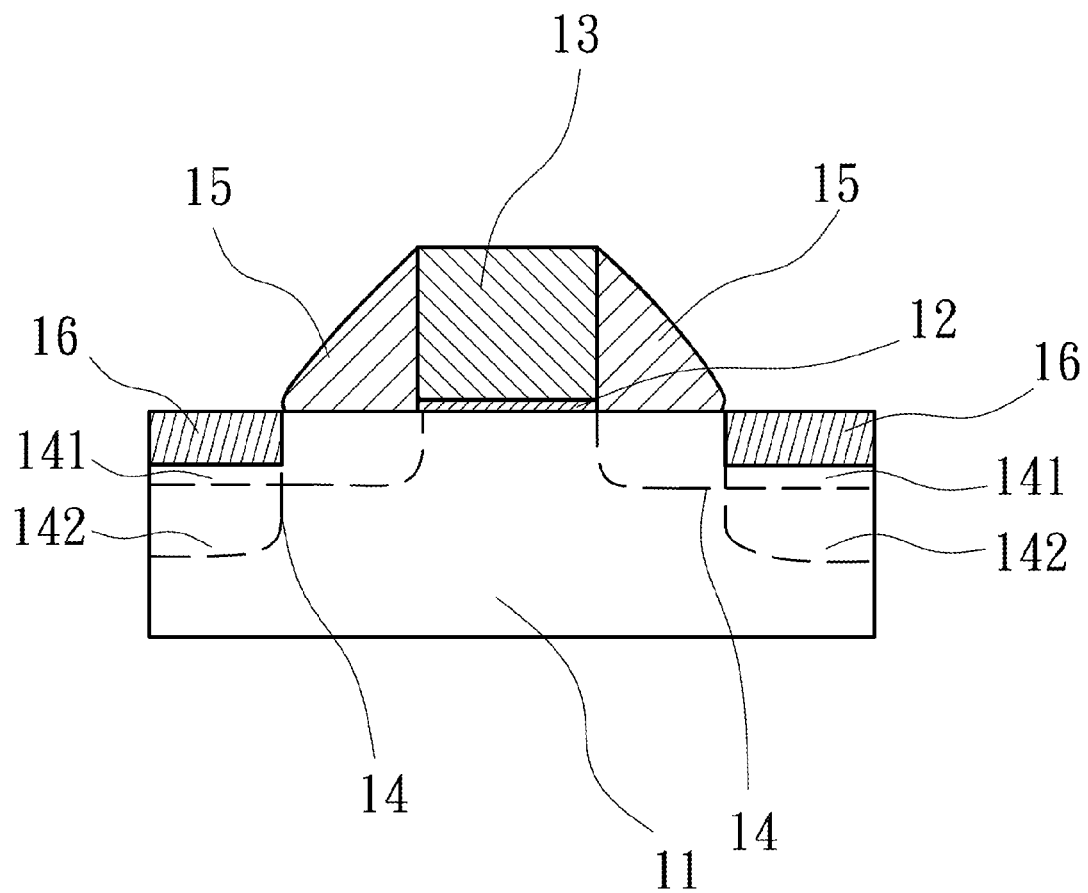
FIG. 5 is an end view in partial section of a MOSFET with a first silicide in lightly doped source/drain regions and heavily doped source/drain regions.

With further reference to FIG. 5, the first silicide (or germanide) (16) is obtained by annealing selected from a group of rapid thermal annealing (RTA), laser annealing and microwave annealing to form the first silicide (or germanide) (16). An embodiment of the invention is obtained by rapid thermal annealing (RTA) at a temperature of 200 to 800° C.

Figure 6:
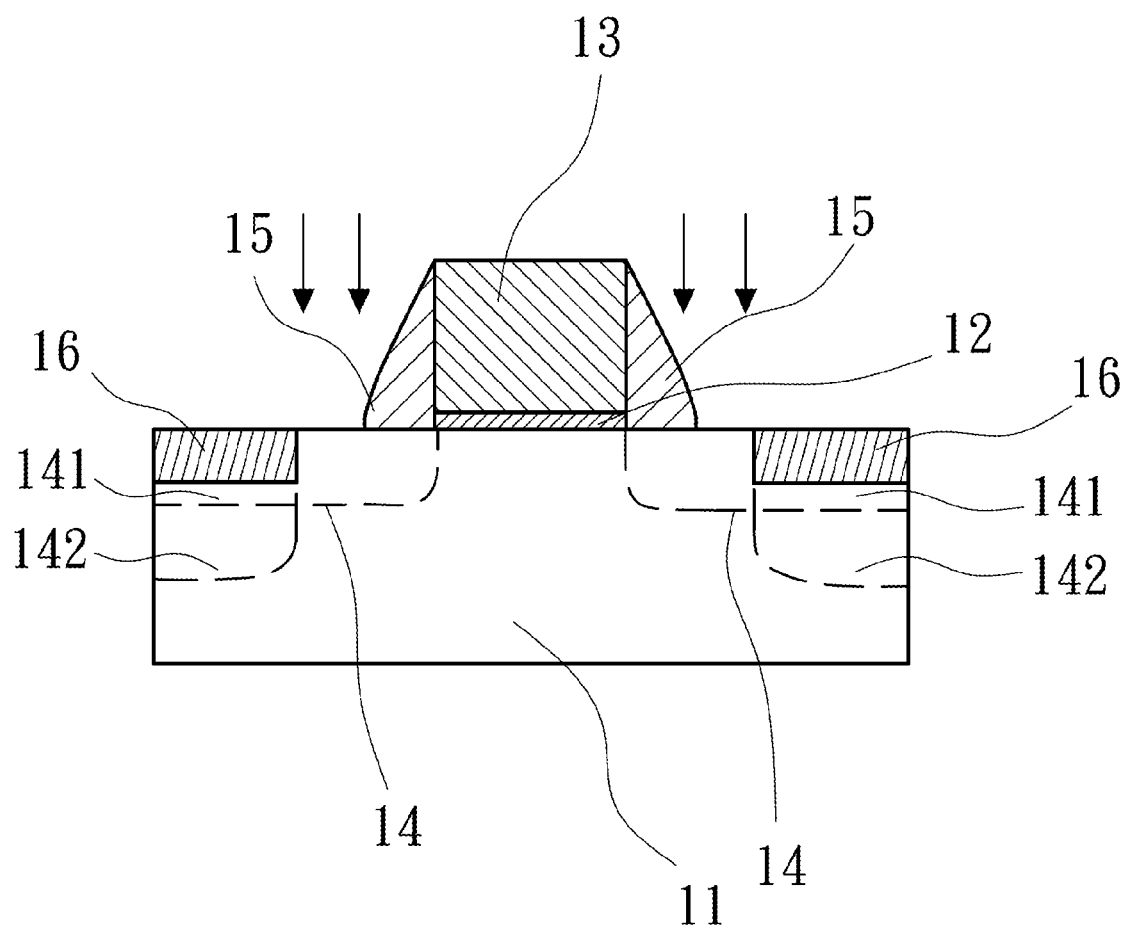
FIG. 6 is an end view in partial section of a MOSFET in FIG. 5 with thickness of sidewall spacers reduced.

In steps (105) and (205) of reducing thickness spacers (15) reveals lightly doped source/drain regions (141) of an exposed surface not covered by the first silicide (or germanide) (16). With further reference to FIG. 6, the spacers (15) are obtained by an etching process (such as wet etching) to reduce thickness of the spacers (15) so the lightly doped source/drain regions (141) expose a surface not covered by the first silicide (or germanide) (16).

In steps (106) and (206) of forming a second silicide (or germanide) (17), the second silicide (or germanide) (17) is formed on an exposed surface of the lightly doped source/drain regions (141) and the heavily doped source/drain regions (142) not covered by the spacers (15) comprises forming a second metal layer (171) over the exposed surface of the lightly doped source/drain regions (141) and the heavily doped source/drain regions (142) not covered by the spacers (15) and annealing the second metal layer (171) to form the second silicide (or germanide) (17).

Figure 7:
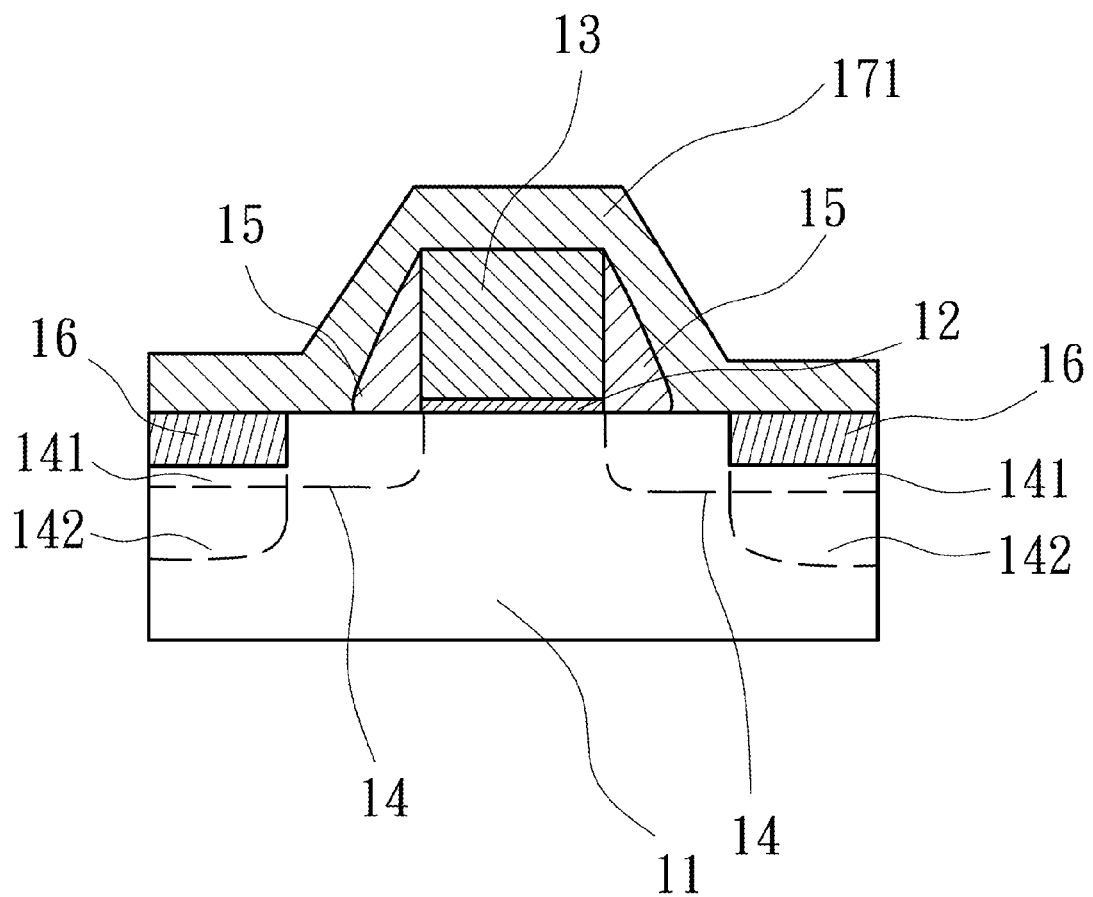
FIG. 7 is an end view in partial section of a MOSFET after formation of a second metal layer over the MOSFET in FIG. 6.

With further reference to FIG. 7, second metal layers (171) are formed over the lightly doped source/drain regions (141), the heavily doped source/drain regions (142), the spacers (15) and the gate (13) using any desired formation process (such as atomic layer deposition, electron beam evaporation, sputtering or any combination(s) thereof) to a thickness of 20 to 1000 Angstroms, though a thinner or thicker layer may also be used. The second metal layer (171) is Ytterbium or Erbium.

Figure 8:
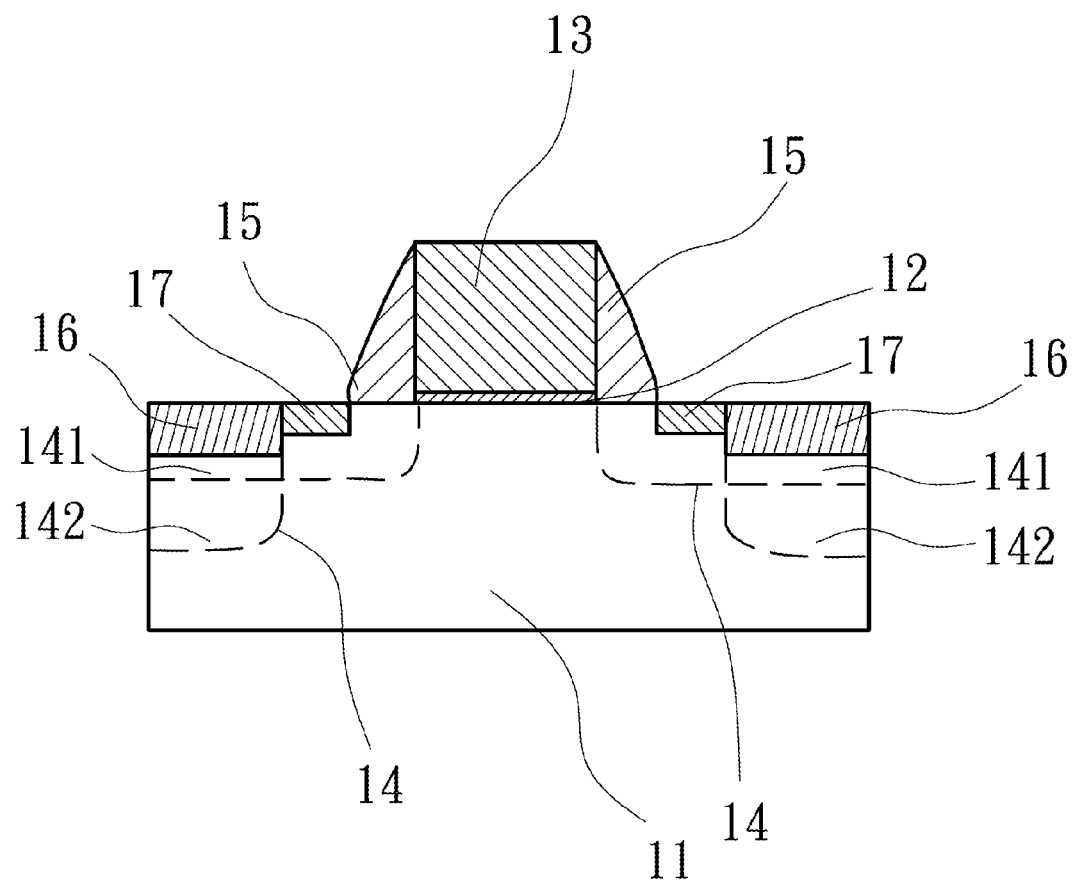
FIG. 8 is an end view in partial section of a MOSFET after formation of a second silicide in the lightly doped source/drain regions in FIG. 7.

With further reference to FIG. 8, the second silicide (or germanide) (17) is obtained by annealing selected from a group consisting of rapid thermal annealing (RTA), laser annealing and microwave annealing to form the second silicide (17). One embodiment of the invention is obtained by rapid thermal annealing (RTA) at a temperature of 200 to 800° C.

However, based on the semiconductor substrate (11) material, this embodiment of the first silicide (16) and second silicide (17) can be replaced with a first germanide (not shown) and a second germanide (not shown) or the first silicide (16) and the second silicide (17) can be replaced for a first silicide/germanide (not shown) and a second silicide/germanide (not shown), but exactly the same way of its implementation, not repeat them.

The dual silicide (or germanide) semiconductor in accordance with the present invention can reduce resistance of the MOSFET source/drain regions, reduce RC delay time response of the MOSFET, and improve performance of the MOSFET.

What is claimed is:

1. A method for making a dual silicide semiconductor comprising:
   providing a semiconductor substrate;
   forming a gate assembly comprising:
      forming an insulating layer on the semiconductor substrate; and
      forming a gate on the insulating layer;
   forming source/drain regions comprising:
      forming lightly doped source/drain regions in the semiconductor substrate adjacent to the insulating layer by implantation;
      forming spacers adjacent to the gate and over part of the lightly doped source/drain regions; and
      forming heavily doped source/drain regions in the semiconductor substrate by implantation;
   forming a first silicide on an exposed surface of the lightly doped source/drain regions and the heavily doped source/drain regions not covered by the spacers;
   reducing thickness of the spacers, after forming the first silicide, so the lightly doped source/drain regions of exposed surface are not covered by the first silicide; and
   forming a second silicide on an exposed surface of the lightly doped source/drain regions,
   wherein the first silicide is formed by a first metal layer and the source/drain regions, the second silicide is formed by a second metal layer and the source/drain regions, the first metal layer and the second metal layer are different materials.

2. The method for making a dual silicide semiconductor as claimed in claim 1, wherein forming the first silicide comprises:
   forming the first metal layer over the exposed surface of the lightly doped source/drain regions and the heavily doped source/drain regions not covered by the spacers; and
   annealing the first metal layer to form the first silicide,
   wherein the first metal layer is selected from the group consisting of nickel and cobalt.

3. The method for making a dual silicide semiconductor as claimed in claim 1, wherein the reducing step is performed by etching procedures.

4. The method for making a dual silicide semiconductor as claimed in claim 1, wherein forming the second silicide comprises:
   forming the second metal layer over the exposed surface of the lightly doped source/drain regions; and
   annealing the second metal layer to form the second silicide,
   wherein the second metal layer is selected from the group consisting of ytterbium and erbium.

5. The method for making a dual silicide semiconductor as claimed in claim 2, wherein the forming step of the first metal layer is a process selected from a group of atomic layer deposition, electron beam evaporation, a sputtering technique and a combination thereof to a thickness of 20 to 1000 Angstroms.

6. The method for making a dual silicide semiconductor as claimed in claim 2, wherein annealing is selected from a group of rapid thermal annealing, laser annealing and microwave annealing.

7. The method for making a dual silicide semiconductor as claimed in claim 4, wherein the forming step of the second metal layer is selected from atomic layer deposition, electron beam evaporation and sputtering.

8. The method for making a dual silicide semiconductor as claimed in claim 4, wherein annealing is selected from rapid thermal annealing, laser annealing and microwave annealing.

9. The method for making a dual silicide semiconductor as claimed in claim 6, wherein rapid thermal annealing is performed at a temperature of 200 to 800° C.

10. The method for making a dual silicide semiconductor as claimed in claim 8, wherein the annealing procedure is performed at a temperature of 200 to 800° C.

11. A method for making a dual germanide semiconductor comprising:
   providing a semiconductor substrate;
   forming a gate assembly comprising:
      forming an insulating layer on the semiconductor substrate; and
      forming a gate on the insulating layer;
   forming source/drain regions comprising:
      forming lightly doped source/drain regions in the semiconductor substrate adjacent to the insulating layer by implantation;
      forming spacers adjacent to the gate and over part of the lightly doped source/drain regions; and
      forming heavily doped source/drain regions in the semiconductor substrate by implantation;
   forming a first germanide on an exposed surface of the lightly doped source/drain regions and the heavily doped source/drain regions not covered by the spacers;
   reducing thickness of the spacers, after forming the first germanide, so the lightly doped source/drain regions of exposed surface are not covered by the first germanide; and
   forming a second germanide on an exposed surface of the lightly doped source/drain regions,
   wherein the first germanide is formed by a first metal layer and the source/drain regions, the second germanide is formed by a second metal layer and the source/drain regions, the first metal layer and the second metal layer are different materials.

12. The method for making a dual germanide semiconductor as claimed in claim 11, wherein forming the first germanide comprises:
   forming the first metal layer over the exposed surface of the lightly doped source/drain regions and the heavily doped source/drain regions not covered by the spacers; and
   annealing the first metal layer to form the first germanide, wherein the first metal layer is selected from the group consisting of nickel and cobalt.

13. The method for making a dual germanide semiconductor as claimed in claim 11, wherein the reducing step is performed by etching procedures.

14. The method for making a dual germanide semiconductor as claimed in claim 11, wherein forming the second germanide comprises:
   forming the second metal layer over the exposed surface of the lightly doped source/drain regions; and
   annealing the second metal layer to form the second germanide,
   wherein the second metal layer is selected from the group consisting of ytterbium and erbium.

15. The method for making a dual germanide semiconductor as claimed in claim 12, wherein the forming step of the first metal layer is a process selected from a group of atomic layer deposition, electron beam evaporation, a sputtering technique and a combination thereof to a thickness of 20 to 1000 Angstroms.

16. The method for making a dual germanide semiconductor as claimed in claim 12, wherein annealing is selected from a group of rapid thermal annealing, laser annealing and microwave annealing.

17. The method for making a dual germanide semiconductor as claimed in claim 14, wherein the forming step of the second metal layer is selected from a group of atomic layer deposition, electron beam evaporation and sputtering.

18. The method for making a dual germanide semiconductor as claimed in claim 14, wherein the annealing step is selected from rapid thermal annealing, laser annealing and microwave annealing.

19. The method for making a dual germanide semiconductor as claimed in claim 16, wherein the annealing procedure is performed at a temperature of 200 to 800° C.

20. The method for making a dual germanide semiconductor as claimed in claim 18, wherein the annealing procedure is performed at a temperature of 200 to 800° C.

* * * * *